US008648637B2

(12) United States Patent
Kim et al.

(10) Patent No.: US 8,648,637 B2
(45) Date of Patent: Feb. 11, 2014

(54) SLEW RATE BOOST CIRCUIT, OUTPUT BUFFER HAVING THE SAME, AND METHOD THEREOF

(75) Inventors: Min-sung Kim, Cheongju-si (KR); Il-kwon Chang, Cheongju-si (KR); Ji-ho Lew, Cheongju-si (KR); Young-chul Kim, Cheongju-si (KR); Joon-yul Yun, Cheongju-si (KR); Don-woo Lee, Cheongju-si (KR); So-youn Kim, Cheongju-si (KR); Kyung-won Min, Cheongju-si (KR); Jae-hoon Lee, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 83 days.

(21) Appl. No.: 13/151,891

(22) Filed: Jun. 2, 2011

(65) Prior Publication Data

US 2012/0013378 A1 Jan. 19, 2012

(30) Foreign Application Priority Data

Jul. 19, 2010 (KR) ........................ 10-2010-0069425

(51) Int. Cl.
*H03K 5/12* (2006.01)

(52) U.S. Cl.
USPC ............................ 327/170; 327/172; 327/175

(58) Field of Classification Search
USPC .......................................... 327/170, 172, 175
See application file for complete search history.

(56) References Cited

U.S. PATENT DOCUMENTS

| | | | | |
|---|---|---|---|---|
| 5,598,119 A * | 1/1997 | Thayer et al. | ................. | 327/111 |
| 7,030,670 B2 * | 4/2006 | Lin | .............................. | 327/170 |
| 7,760,199 B2 | 7/2010 | An | | |
| 2006/0279356 A1 | 12/2006 | An | | |
| 2008/0106297 A1 | 5/2008 | Jao | | |

FOREIGN PATENT DOCUMENTS

| | | |
|---|---|---|
| KR | 10-0717278 | 5/2007 |
| KR | 10-2007-0070818 | 7/2007 |
| KR | 10-0880223 B1 | 1/2009 |

OTHER PUBLICATIONS

Korean Office Action issued Nov. 3, 2011, in counterpart Korean Application No. 10-2010-0069425 (5pp.).

Korean Notice of Allowance dated Apr. 23, 2012, issued in counterpart Korean Patent Application No. 10-2010-0069425; 5 pages.

* cited by examiner

*Primary Examiner* — John Poos
(74) *Attorney, Agent, or Firm* — NSIP Law

(57) ABSTRACT

A slew rate boost circuit for an output buffer and an output buffer circuit for a source driver having the same are provided. In an output buffer including a pull-up unit providing a buffer output signal in a first level by receiving a buffer input signal and performing pull-up operation and a pull-down unit providing a buffer output signal in a second level having opposite phase from the first level by receiving the buffer input signal and performing pull-down operation, the slew rate boost circuit includes a first comparator generating a first boost signal to boost pull-up operation of the pull-up unit of the output buffer by inputting a first input signal and a second input signal and a second comparator generating a second boost signal to boost pull-down operation of the pull-down unit of the output buffer by inputting the first input signal and the second input signal.

33 Claims, 8 Drawing Sheets

SLEW RATE BOOST CIRCUIT, OUTPUT BUFFER HAVING THE SAME, AND METHOD THEREOF

CROSS-REFERENCE TO RELATED APPLICATION(S)

This application claims from the benefit under 35 U.S.C. §119(a) of Korean Patent Application No. 2010-0069425, filed on Jul. 19, 2010, in the Korean Intellectual Property Office, the entire disclosure of which is incorporated herein by reference for all purposes.

BACKGROUND

1. Field

The following description relates to a source driver, and more particularly, to a slew rate boost circuit for an output buffer and an output buffer for a source driver having the same.

2. Description of the Related Art

In a liquid crystal display (LCD) apparatus which is a representative flat panel display, a maximum driving frequency increases as resolution increases. Therefore, a source driver for driving the liquid crystal panel of the liquid crystal display apparatus should drive a desired target value in a short time. However, as a load of the liquid crystal panel increases, the slew rate of the source driver decreases. The slew rate shows how fast an output signal catches up with an input signal, and represents a gradient of time versus voltage. If the slew rate is small, the source driver may not provide a desired target value to the liquid crystal panel, thereby degrading image quality.

Increasing the size of a drive transistor of an output buffer could be a way to obtain a high slew rate in a source drive with heavy load. However, this method requires a large space, and thus, drives up a cost.

SUMMARY

In one general aspect, there is provided a slew rate boost circuit for an output buffer comprising a pull-up unit providing a buffer output signal in a first level by receiving a buffer input signal and performing pull-up operation, and a pull-down unit providing a buffer output signal in a second level having opposite phase from the first level by receiving the buffer input signal and performing pull-down operation, the circuit comprising: a first comparator configured to generate a first boost signal configured to boost a pull-up operation of the pull-up unit of the output buffer by inputting a first input signal and a second input signal; and a second comparator configured to generate a second boost signal configured to boost a pull-down operation of the pull-down unit of the output buffer by inputting the first input signal and the second input signal.

In the circuit: the first input signal may comprise the buffer input signal; and the second input signal may comprise the buffer output signal.

In the circuit, the first comparator may be further configured to generate the first boost signal in response to the buffer input signal being changed from a high level to a low level.

In the circuit, the first comparator may be further configured to be disabled after generating the first boost signal.

In the circuit, the first comparator may comprise: a first comparing unit configured to receive and compare the first and the second input signals; and a first signal generating unit configured to generate the first boost signal, according to an output signal of the first comparing unit.

In the circuit: the pull-up unit may comprise: a PMOS transistor; and a current minor comprising a pair of PMOS transistors; and the pull-down unit may comprise: an NMOS transistor; and a current minor comprising a pair of NMOS transistors.

In the circuit: the first comparing unit may comprise a pair of transistors configured for differential amplification in which a first input signal and a second input signal are provided to a respective gate; and the output signal of the first comparing unit may be provided to a drain of a transistor where the first input signal is provided from among the pair of transistors.

In the circuit, the first signal generating unit may comprise: a first PMOS transistor configured to perform a current minor operation, based on a first bias signal; and a second PMOS transistor which is connected to the first PMOS transistor and configured to generate the first boost signal, based on the output signal of the first comparing unit, wherein the first signal generating unit is further configured to provide the first boost signal to the current minor of the pull-down unit.

In the circuit: the first comparing unit may comprise a pair of transistors configured for differential amplification in which a first input signal and a second input signal are provided to a respective gate; and the output signal of the first comparing unit may be provided to a drain of a transistor where the second input signal is provided from among the pair of transistors.

In the circuit, the first signal generating unit may comprise: a first PMOS transistor configured to perform a current minor operation, based on a first bias signal; and a second PMOS transistor which is connected to the first PMOS transistor and configured to generate the first boost signal, based on the output signal of the first comparing unit, wherein the first signal generating unit is further configured to provide the first boost signal to a pull-down transistor of the pull-down unit.

In the circuit: the pull-up unit may comprise a PMOS transistor; and the pull-down unit may comprise an NMOS transistor.

In the circuit: the first comparing unit may comprise a pair of NMOS transistors configured for differential amplification in which a first input signal and a second input signal are provided to a respective gate; and the output signal of the first comparing unit may be provided to a drain of a transistor where the second input signal is provided from among the NMOS transistors.

In the circuit, the first signal generating unit may comprise: a first PMOS transistor configured to perform a current minor operation, based on a first bias signal; and a second PMOS transistor which is connected to the first PMOS transistor and configured to generate the first boost signal, based on the output signal of the first comparing unit, wherein the first signal generating unit is further configured to provide the first boost signal to the pull-down transistor of the pull-down unit.

In the circuit, the first comparator may further comprise a first controller configured to disable operation of the first comparing unit after the first comparing unit generates the first boost signal.

In the circuit, the first controller may comprise a first NMOS transistor which is connected to the first comparing unit and configured to disable operation of the first comparing unit, based on a first enable signal.

In the circuit, the second comparator may be further configured to generate the second boost signal in response to the buffer input signal being changed from a low level to a high level.

In the circuit, the second comparator may be further configured to be disabled after generating the second boost signal.

In the circuit, the second comparator may comprise: a second comparing unit configured to input and compare the first and the second input signals; and a second signal generating unit configured to generate the second boost signal, according to an output signal of the second comparing unit.

In the circuit: the pull-up unit may comprise: a PMOS transistor; and a current minor comprising a pair of PMOS transistors; and the pull-down unit may comprise: an NMOS transistor; and a current minor comprising a pair of NMOS transistors.

In the circuit: the second comparing unit may comprise a pair of PMOS transistors configured for differential amplification in which a first input signal and a second input signal are provided to a respective gate; and the output signal of the second comparing unit may be provided to a drain of a transistor where the first input signal is provided from among the PMOS transistors.

In the circuit, the second signal generating unit may comprise: a second NMOS transistor configured to perform a current mirror operation, based on a second bias signal comprising an opposite phase from the first bias signal; and a third NMOS transistor which is connected to the second NMOS transistor and configured to generate the second boost signal, based on the output signal of the second comparing unit, wherein the second signal generating unit is further configured to provide the second boost signal to the current mirror of the pull-up unit.

In the circuit: the second comparing unit may comprises a pair of PMOS transistors configured for differential amplification in which a first input signal and a second input signal are provided to a respective gate; and the output signal of the second comparing unit may provided to a drain of a transistor where the second input signal is provided from among the PMOS transistors.

In the circuit, the second signal generating unit may comprise: a second NMOS transistor configured to perform a current mirror operation, based on a second bias signal comprising an opposite phase from the first bias signal; and a third NMOS transistor which is connected to the second NMOS transistor and configured to generate the second boost signal, based on the output signal of the second comparing unit, wherein the second signal generating unit is further configured to provide the second boost signal to the pull-up transistor of the pull-up unit.

In the circuit: the pull-up unit may comprise a PMOS transistor; and the pull-down unit may comprise an NMOS transistor.

In the circuit: the first comparing unit may comprise a pair of PMOS transistors configured for differential amplification in which a first input signal and a second input signal are provided to a respective gate; and the output signal of the second comparing unit may be provided to a drain of a transistor where the second input signal is provided from among the PMOS transistors.

In the circuit, the second signal generating unit may comprise: a second NMOS transistor configured to performs a current mirror operation, based on a second bias signal comprising an opposite phase from the first bias signal; and a third PMOS transistor which is connected to the second PMOS transistor and configured to generate the second boost signal, based on the output signal of the second comparing unit, wherein the second signal generating unit is further configured to provide the second boost signal to the pull-up transistor of the pull-up unit.

In the circuit, the second comparator may further comprise a second controller configured to disable operation of the second comparing unit after the second comparing unit generates the second boost signal.

In the circuit, the second controller may comprise a third PMOS transistor which is connected to the second comparing unit and configured to disable operation of the first comparing unit, based on a second enable signal comprising an opposite phase from the first enable signal.

In another general aspect, there is provided an output buffer for a source driver, the output buffer comprising: an amplifying circuit unit comprising: a pull-up unit configured to provide a buffer output signal in a first level by: receiving a buffer input signal; and performing a pull-up operation; and a pull-down unit configured to provide a buffer output signal in a second level comprising an opposite phase from the first level by: receiving the buffer input signal; and performing a pull-down operation; and a slew rate boost circuit unit configured to generate a first boost signal and a second boost signal to boost the pull-up operation of the pull-up unit and the pull-down operation of the pull down unit of the amplifying circuit unit by: setting the buffer input signal as a first input signal; and setting the buffer output signal as a second input signal.

In the output buffer, the slew rate boost circuit unit may comprise: a first comparator configured to: input the first and the second input signals; and generate the first boost signal; and a second comparator configured to: input the first and the second input signals; and generate the second boost signal.

In the output buffer, each of the first and the second comparators may comprise: a comparing unit configured to input and compare the first and the second input signals; and a signal generating unit configured to generate the first and second boost signals, according to an output signal of the comparing unit.

In the output buffer, each of the comparators may further comprise a controller configured to disable operation of the comparators, based on a first enable signal and a second enable signal after the comparators generate the first and the second boost signals.

In another general aspect, there is provided a source driver with an output buffer which inputs an input signal and provides an output signal, the source driver comprising: an amplifying circuit unit comprising: a pull-up unit configured to provide a buffer output signal in a first level by: receiving a buffer input signal; and performing a pull-up operation; and a pull-down unit configured to provide a buffer output signal in a second level comprising an opposite phase from the first level by: receiving the buffer input signal; and performing a pull-down operation; and a slew rate boost circuit unit configured to generate a first boost signal and a second boost signal to boost the pull-up operation of the pull-up unit and the pull-down operation of the pull down unit of the amplifying circuit unit by: setting the buffer input signal as a first input signal; and setting the buffer output signal as a second input signal.

In another general aspect, there is provided a method for a slew rate boost circuit for an output buffer, the method comprising: generating, by a first comparator, a first boost signal configured to boost a pull-up operation of a pull-up unit of an output buffer by inputting a first input signal and a second input signal; and generating, by a second comparator, a second boost signal configured to boost a pull down operation of a pull-down unit of an output buffer by inputting the first input signal and the second input signal.

In another general aspect, there is provided a slew rate boost circuit for an output buffer, the circuit comprising: a first comparator configured to generate a first boost signal configured to boost a pull-up operation of a pull-up unit of an output buffer by inputting a first signal and a second signal; and a second comparator configured to generate a second boost signal configured to boost a pull-down operation of a pull-down unit of an output buffer by inputting the first signal and the second signal.

In the circuit, the first comparator may be further configured to generate the first boost signal in response to the first signal being changed from a high level to a low level.

In the circuit, the first comparator may be further configured to be disabled after generating the first boost signal.

In the circuit, the first comparator may comprise: a first comparing unit configured to receive and compare the first and the second signals; and a first signal generating unit configured to generate the first boost signal, according to an output signal of the first comparing unit.

In the circuit, the second comparator may be further configured to generate the second boost signal in response to the first signal being changed from a low level to a high level.

In the circuit, the second comparator may comprise: a second comparing unit configured to input and compare the first and second signals; and a second signal generating unit configured to generate the second boost signal, according to an output signal of the second comparing unit.

Other features and aspects may be apparent from the following detailed description, the drawings, and the claims.

Figure 1:
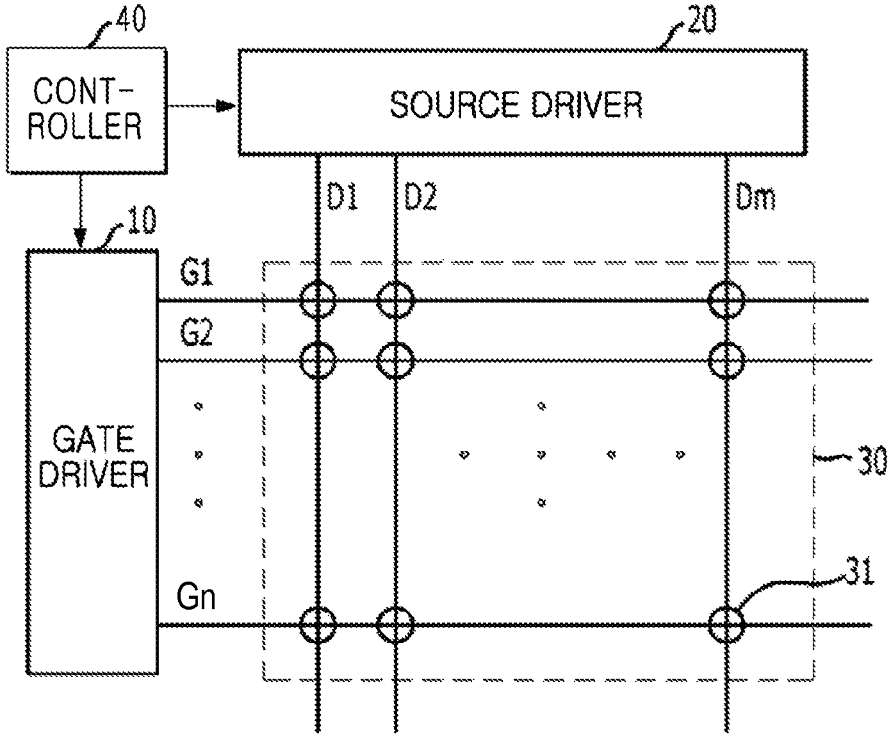
FIG. 1 is a block diagram illustrating a flat panel display element according to an example embodiment.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, descriptions of well-known functions and constructions may be omitted for increased clarity and conciseness.

FIG. 1 is a schematic block diagram illustrating a flat panel display apparatus according to an example embodiment. Referring to FIG. 1, the flat panel display apparatus may include a gate driver 10 which may provide a driving signal to a plurality of gate lines (G1-Gn), a source driver 20 which may provide a data signal to a plurality of data lines (D1-Dm), and a flat display panel 30 on which a plurality of pixels 31 may be disposed at a crossing of the gate lines (G1-Gn) and the data lines (D1-Dm).

The pixels 31 disposed on the flat display panel 30 may be driven by a gate driving signal which may be provided to the gate lines (G1-Gn) from the gate driver 10, and may display an image, based on data which may be provided to the data lines (D1-Dm) from the source driver 20. The flat display panel 30 may include a liquid crystal display (LCD) panel.

The flat display panel may further include a controller 40 to control the gate driver 10 and the source driver 20.

Figure 2:
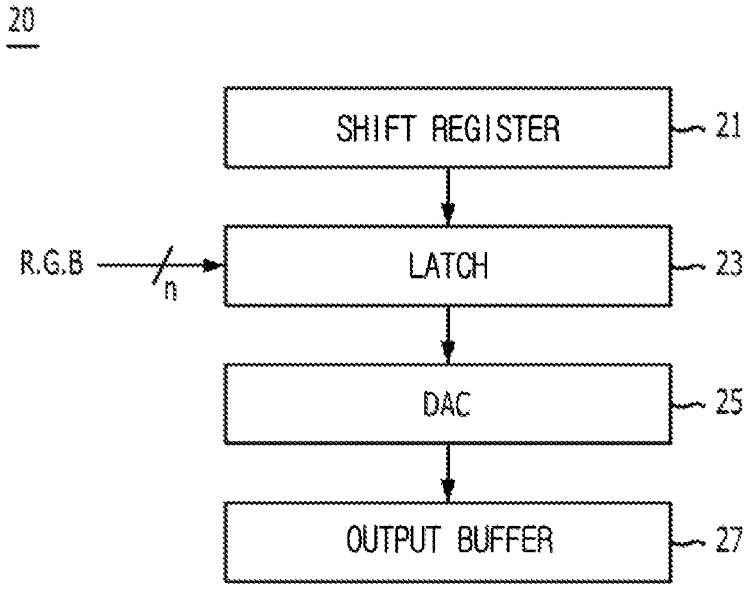
FIG. 2 is a block diagram illustrating a source driver in FIG. 1.

FIG. 2 is a block diagram illustrating the source driver 20 in FIG. 1. Referring to FIG. 2, the source driver may include a shift register 21, a latch 23, a digital-analog converter (DAC) 25, and an output buffer 27.

The R, G, B (red, green, blue) data of each pixel 31 may be sampled for each column line based on a latch enabling signal provided from the shift register 21 and stored in the latch 23. The digital-analog converter 25 may convert digital R, G, B data stored in the latch 23 into analog R, G, B data. The output buffer 27 may amplify the analog R, G, B data signal which may have been converted by the digital-analog converter 27, and may provide the amplified signal to each pixel 31 of the flat display panel 30 through the data lines (D1-Dm). Accordingly, the flat display panel 30 may display a desired image.

Figure 3:
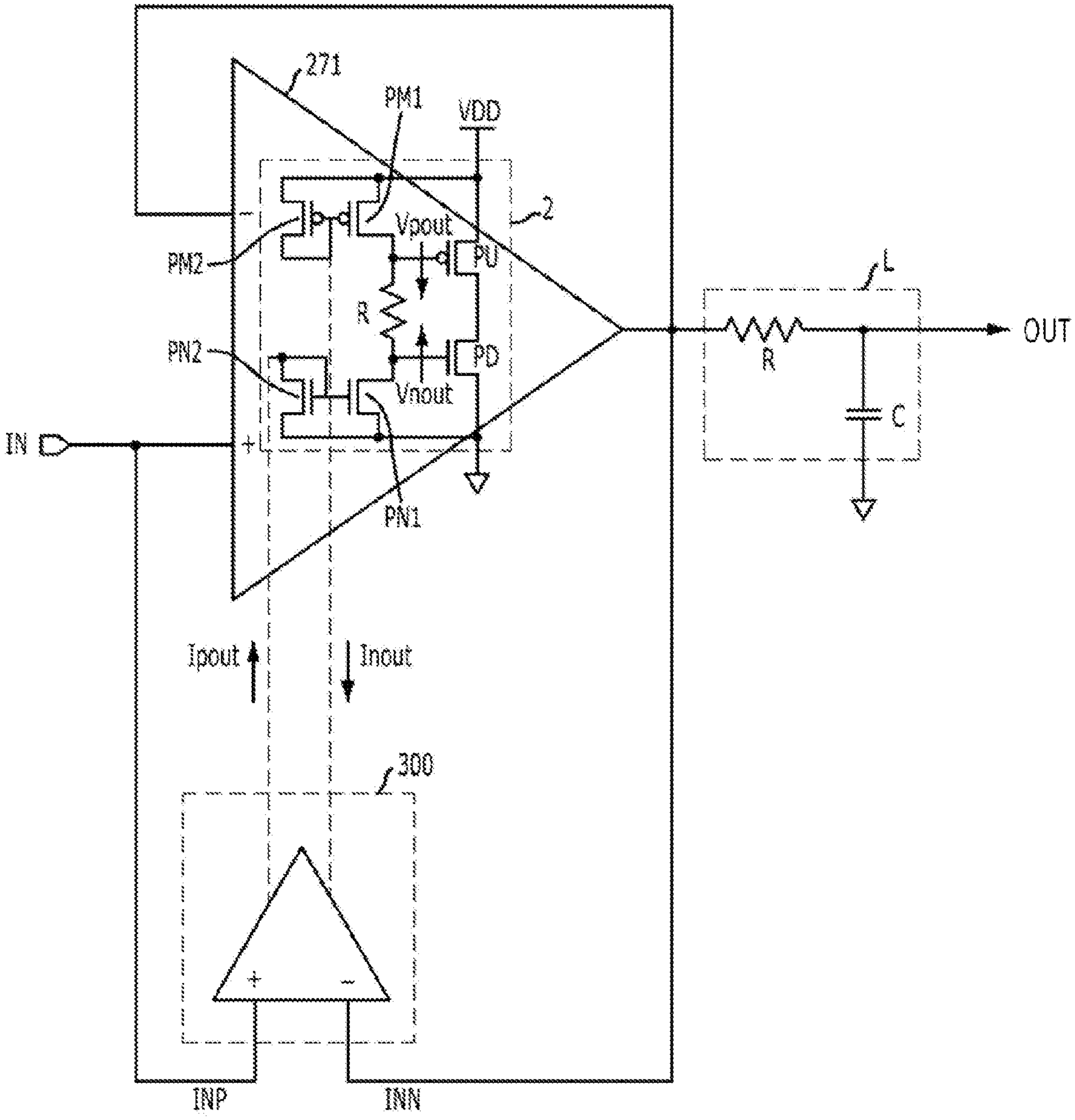
FIG. 3 is a block diagram illustrating an output buffer according to an example embodiment.

FIG. 3 is a block diagram illustrating an output buffer for a source driver according to an example embodiment. Referring to FIG. 3, the output buffer 27 may include an amplifying circuit unit 271 and a slew rate boost circuit unit 300. The amplifying circuit unit 271 may receive a buffer input signal IN and may provide a buffer output signal OUT of a first level or a second level. The amplifying circuit unit 271 may be an amplifier which may provide the buffer output signal OUT by amplifying a buffer input signal IN, and may include a unity gain amplifier.

In FIG. 3, the amplifying circuit unit 271 may include an output end 2 which may provide the buffer output signal OUT. The amplifying circuit unit 271 may include a pull-up unit which may provide the buffer output signal OUT of the first level by performing a pull-up operation based on the buffer input signal IN, and a pull-down unit which may provide the buffer output signal OUT of the second level by performing a pull-down operation based on the buffer input signal IN.

The pull-up unit may include a pull-up transistor PU which may provide a pull-up signal to a gate and may be connected between a power supply voltage, e.g., VDD, and an output end. The pull-up transistor PU may include a PMOS transistor. The pull-up unit may further include a current minor which may include PMOS transistors PM1, PM2. The pull-down unit may include a pull-down transistor PD which may provide a pull-down signal to a gate and may be connected between a ground voltage, e.g., VSS, and an output end. The pull-down transistor PD may include an NMOS transistor. The pull-down unit may further include a current mirror which may include NMOS transistors PN1, PN2. The gates of the pull-up transistor PU and the pull-down transistor PD may be further connected to a resistance R.

The slew rate boost circuit unit 300 may provide a first boost signal Ipout and a second boost signal Inout to the amplifying circuit unit 271 by setting the buffer input signal IN as a first input signal INP and setting the buffer output signal as a second input signal INN. The first boost signal Ipout may be provided to the pull-down unit of the amplifying circuit unit 271 to boost the pull-down operation, and the second boost signal Inout may be provided to the pull-up unit of the amplifying circuit unit 271 to boost the pull-up operation.

In FIG. 3, L refers to load, and may comprise a resistance R and a capacitor C.

Figure 4:
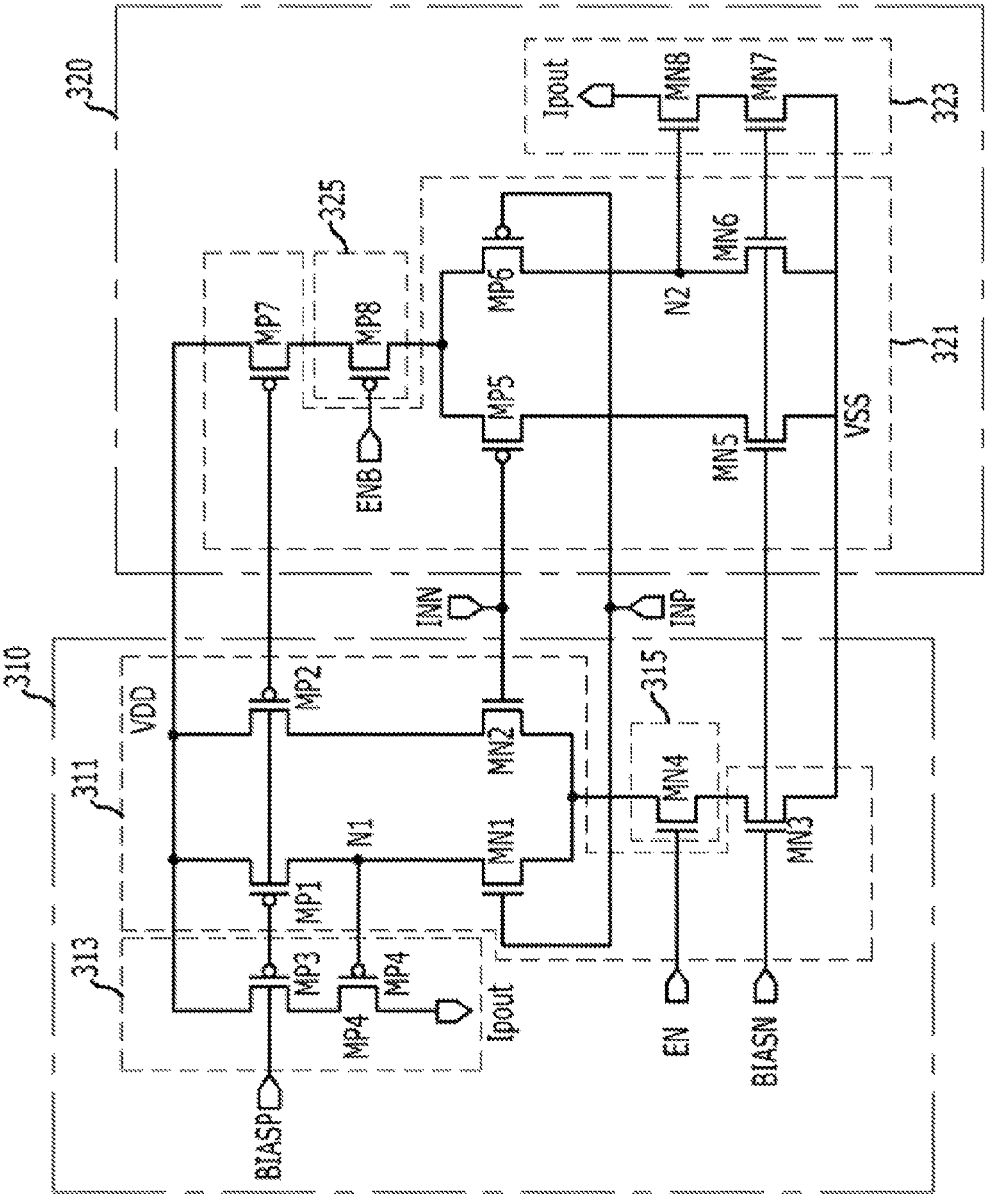
FIG. 4 is a detailed circuit diagram of the output buffer in FIG. 3.

FIG. 4 is a detailed circuit diagram of the slew rate boost circuit 300 in FIG. 3. Referring to FIG. 4, the slew rate boost circuit unit 300 may include a first comparator 310 which may provide the first boost signal Ipout to the pull-down unit of the amplifying circuit unit 271 by comparing the first input signal INP, which is the buffer input signal IN, with the second input signal INN, which is the buffer output signal OUT; and a second comparator 320 which may provide the second boost signal Inout to the pull-up unit of the amplifying circuit unit 271 by comparing the first input signal INP with the second input signal INN.

The first comparator 310 may include a first comparing unit 311 which may compare the first and the second input signals INP, INN and a first signal generating unit 313 which may generate the first boost signal Ipout based on an output signal of the first comparing unit 311.

The first comparing unit 311 may include PMOS transistors MP1, MP2 which may provide a current mirror by providing a first bias signal BIASP to a gate, and NMOS transistors MN1, MN2 which may differentially amplify the first and second input signals INP, INN provided to a gate, and may provide an output signal N1 to a drain (a drain of an NMOS transistor) of the PMOS transistor MP1 to which the first input signal INP is provided.

The first comparator 311 may further include an NMOS transistor MN3 which may enable operation of the first comparator 311 by providing a second bias signal BIASN to a gate. The second bias signal BIASN may be a signal which has an opposite phase from the first bias signal BIASP.

The first signal generating unit 313 may include a PMOS transistor MP3 which may provide a current mirror by providing the first bias voltage BIASP to the gate, and a PMOS transistor MP4 which may generate a first boost signal Ipout by providing the output signal N1 of the first comparator 311 to a gate.

The first comparator 310 may further include a first controller 315 which may control operation of the first comparator 310. In response to the first comparator 310 generating the first boost signal Ipout, the first controller 315 may disable operation of the first comparator 310. The first controller 315 may include an NMOS transistor MN4 where a first enable signal EN is applied to a gate.

The second comparator 320 may include a second comparing unit 321 which may compare the first and the second input signals INP, INN, and a second signal generating unit 323 which may generate the second boost signal Inout based on an output signal of the second comparing unit 321.

The second comparing unit 321 may include NMOS transistors MN5, MN6 which may provide a current minor by providing a second bias voltage BIASN to a gate, and PMOS transistors MP6, MN5 which may differentially amplify the first and second input signals INP, INN provided to a gate, and may provide an output signal N2 to a drain (a drain of an NMOS transistor MN6) of the PMOS transistor MP6 to which the first input signal INP is provided. The second comparator 321 may further include a PMOS transistor MP7 which may enable operation of the second comparator 321 by providing the first bias signal BIASP to a gate.

The second signal generating unit 323 may include an NMOS transistor MN7 which may provide a current mirror by providing the second bias voltage BIASN to the gate, and an NMOS transistor MN8 which may generate a second boost signal Inout by providing the output signal of the second comparator 321 to a gate.

The second comparator 320 may further include a second controller 325 which may control operation of the second comparator 320. In response to the second comparator 320 generating the second boost signal Inout, the second controller 325 may disable operation of the second comparator 320. The second controller 325 may include a PMOS transistor MP8 where a second enable signal ENB is applied to a gate. The second enable signal ENB may be a signal which has an opposite phase from the first enable signal EN.

Operation of the output buffer 27 in FIG. 3 and FIG. 4 will be explained with reference to the operation waveform view in FIG. 5.

Figure 5:
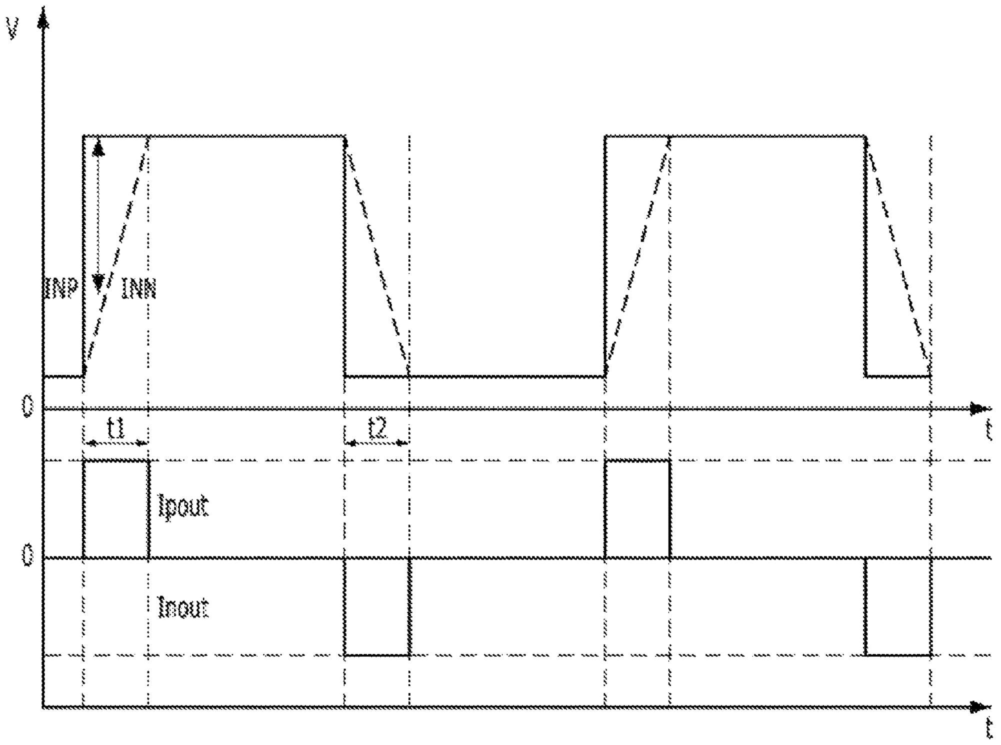
FIG. 5 is an operation waveform view of an output buffer in FIG. 4.

In response to the buffer input signal IN being changed from a first level to a second level, for example, in response to the buffer input signal IN being changed from a low level to a high level, the first input signal INP, which may be a high level signal, and a second input signal INN, which may be a relatively low-level signal in comparison with the first input signal INP, may be provided to the slew rate boost circuit unit 300 as illustrated in FIG. 5. In one example, the first enable signal EN may be a high-level signal, and the second enable signal EN may become a low-level signal. Accordingly, the first and the second comparators 310, 320 may be enabled.

The output node N1 of the first comparing unit 311 of the first comparator 310 may provide a low-level signal, and may be provided to the gate of the PMOS transistor MP4. The PMOS transistor MP4 may be turned on, and the first signal generating unit 313 may generate the first boost signal Ipout, as illustrated in FIG. 5. The first boost signal Ipout may be provided to the pull-down unit of the amplifying circuit unit 271 to form a current pass of current minors PN1, PN2. Accordingly, in response to a current pass being formed by the first boost signal Ipout of the first comparator, the gate voltage level Vnout of a pull-down transistor PD may drop rapidly, and the output circuit OUT of the amplifying circuit unit 271 may become high-level rapidly, based on the buffer input signal IN, as illustrated in FIG. 5.

Meanwhile, in the second comparator 320, the output signal N1 of the second comparator 320 may also become a low-level signal and may be provided to the gate of the NMOS transistor MN8. The NMOS transistor MN8 may be turned off, and the second signal generating unit 323 may cause the second boost signal Inout not to be generated.

The first enable signal EN may become low-level after the buffer output signal OUT is changed to high level in response to the buffer input signal IN being changed from low-level to high-level, and the second enable signal ENB may becomes high-level. Accordingly, the operation of the first and the second comparators 313, 323 may be disabled. It may be desirable that the second enable signal ENB maintains a low level while the buffer input signal IN is changed from a low level to a high level (e.g., in time period t1 of FIG. 5).

In an example embodiment, the first and the second enable signals EN, ENB may be set to be disabled after the first and the second comparators 310, 320 output the buffer output signal OUT based on the buffer input signal IN. Accordingly, after the output signal OUT is output, the operation of the first and the second comparators 310, 320 may be disabled, preventing further consumption of electric current. Therefore, in response to a slew rate boost function being added to the output buffer 27, boost operation may be performed only for a predetermined period of time (e.g., time period t1 in FIG. 5) and thus, consumption of electric current caused by the slew rate boost function added to the output buffer 27 may not be significant.

Meanwhile, in response to the buffer input signal IN being changed from a second level to a first level, for example, in response to the buffer input signal IN being changed from a high level to a low level, the first input signal INP, which may be a low level signal, and a second input signal INN, which may be a relatively high level in comparison with the first input signal INP, may be provided to the slew rate boost circuit unit 300, as illustrated in FIG. 5. In one example, the first enable signal EN may be a high-level signal and the second enable signal EN may become a low-level signal. Accordingly, the first and the second comparators 310, 320 may be enabled.

The output signal N1 of the first comparing unit 311 of the first comparator 310 may become a high-level signal and may be provided to the gate of the PMOS transistor MP4. The PMOS transistor MP4 may be turned off, and the first signal generating unit 313 may cause the first boost signal Ipout not to be generated.

The output signal N2 of the second comparing unit 321 of the second comparator 320 may become a high-level signal and may be provided to the gate of the NMOS transistor MN8. Accordingly, the NMOS transistor MN8 may be turned on, and the second signal generating unit 323 may generate the second boost signal Inout.

The second boost signal Inout may be provided to the pull-up unit of the amplifying circuit unit 271 to form a current pass of current mirrors PM1, PM2. Accordingly, the gate voltage level Vpout of a pull-up transistor PU may increase rapidly through the current minors PM1, PM2 of the pull-up unit, and thus, the output signal OUT of the amplifying circuit unit 271 may become low-level, as illustrated in FIG. 5.

As described above, after the first and the second comparators 310, 320 output the buffer output signal OUT based on the buffer input signal IN, the first and the second enable signals EN, ENB are set to be disabled, disabling the operation of the first and the second comparators 310, 320. It is desirable that the first enable signal EN maintains high level while the buffer input signal IN is changed from high level to low level (t2 in FIG. 5).

Figure 6:
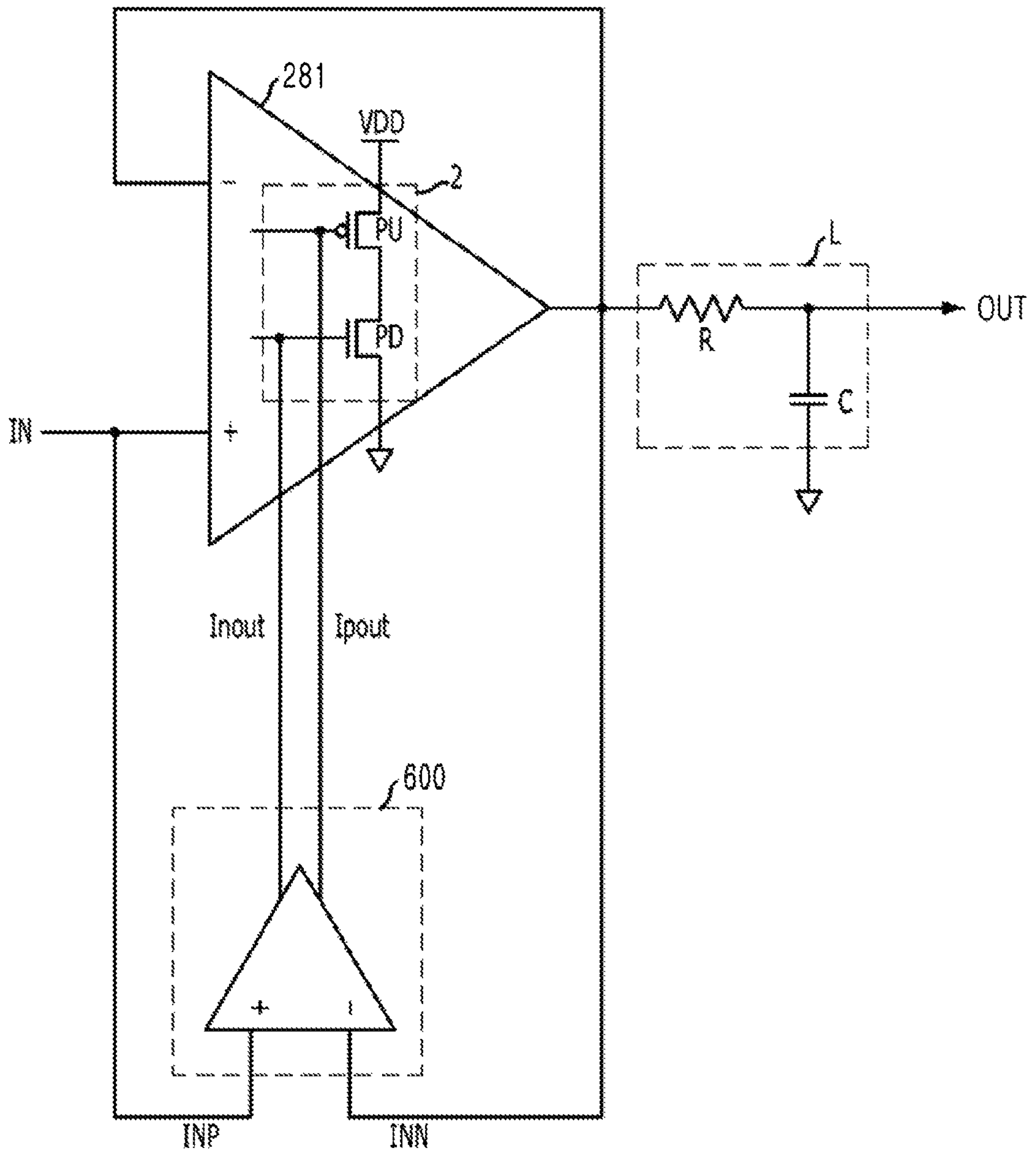
FIG. 6 is a block diagram of an output buffer according to another example embodiment.

FIG. 6 is a block diagram of an output buffer according to another example embodiment. Referring to FIG. 6, an output buffer 27 may include the amplifying circuit unit 281 and the slew rate boost circuit unit 600. The amplifying circuit unit 281 may be an amplifier which may receive the buffer input signal IN to provide the buffer output signal OUT in the first level or the second level, and may include a unity gain amplifier.

In the example of FIG. 6, the amplifying circuit unit 281 may have an output end 2 which may provide the buffer output signal OUT, but this is only an example. The amplifying circuit unit 281 may have a pull-up unit which may provide the buffer output signal in the first level by performing a pull-up operation based on the buffer input signal IN, and a pull-down unit which may provide the buffer output signal OUT in the second level by performing a pull-down operation based on the buffer input signal IN. Unlike in the output buffer in FIG. 3, in the output buffer in the example embodiment, the pull-up unit and the pull-down unit may include only a PMOS transistor PU and an NMOS transistor PD respectively.

The slew rate boost circuit unit 600 may provide a first boost signal Inout and a second boost signal Ipout to the amplifying circuit unit 281 by setting the buffer input signal IN as a first input signal INP and the buffer output signal as a second input signal INN. The first boost signal Inout may be provided to the gate of the pull-down transistor PD of the amplifying circuit unit 281 to boost the pull-down operation, and the second boost signal Ipout may be provided to the gate of the pull-up transistor PU of the amplifying circuit unit 281 to boost the pull-up operation.

Figure 7:
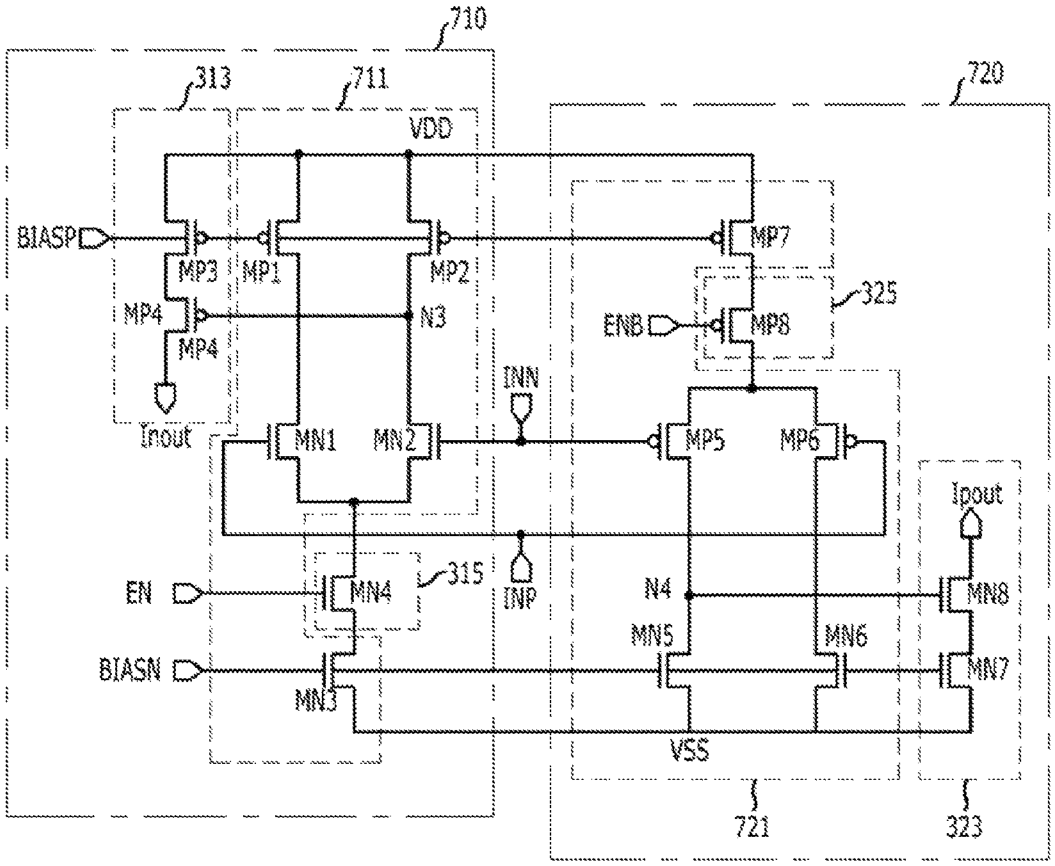
FIG. 7 is a detailed circuit diagram of an output buffer in FIG. 6.

FIG. 7 is a detailed circuit diagram of the slew rate boost circuit unit 600 in FIG. 6. Referring to FIG. 7, the slew rate boost circuit unit 600 may provide a first comparator 710 which may provide the first boost signal Inout to the amplifying circuit unit 281 by comparing the first input signal INP, which is the buffer input signal IN, with the second input signal INN, which is the buffer output signal OUT, and a second comparator 720 which may provide the second boost signal Ipout to the amplifying circuit unit 281 by comparing the first input signal INP with the second input signal INN.

The configuration of the first comparator 710 and the second comparator 720 is mostly the same as that illustrated in FIG. 4. However, the first comparing unit 711 of the first comparator 710 may provide an output signal N3 to a drain (a drain of the NMOS transistor MN2) of the PMOS transistor MP2 where the second input signal INN is provided to a gate, and the second comparator 721 of the second comparator 720 may provide an output signal N4 to a drain (a drain of the NMOS transistor MN5) of the PMOS transistor MP5 where the second input signal INN is provided to a gate.

Accordingly, the first boost signal Inout output from the first comparator 710 may be provided to the gate of the pull-up transistor PU of the amplifying circuit unit 281 directly, and the second boost signal Ipout output from the second comparator 720 may be provided to the gate of the pull-down transistor PD of the amplifying circuit unit 281 directly.

The operation of the output buffer 27 in FIG. 6 and FIG. 7 will be explained with reference to the operation waveform view in FIG. 8.

Figure 8:
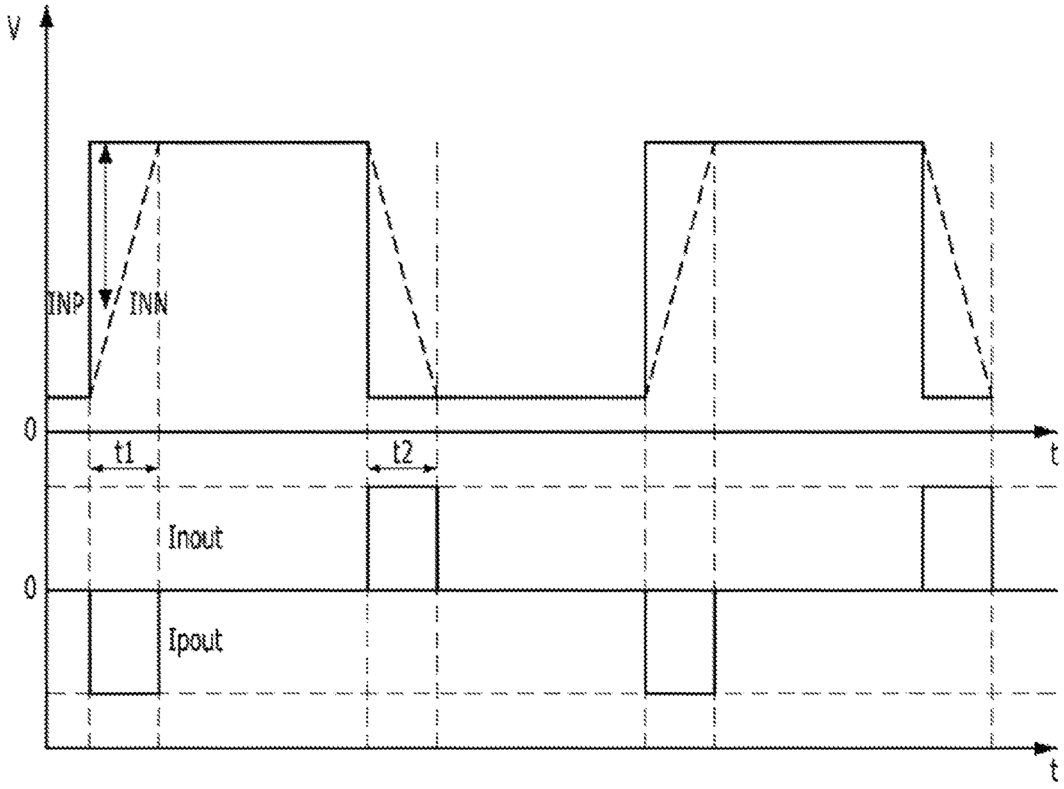
FIG. 8 is an operation waveform view of the output buffer in FIG. 7.

In response to the buffer input signal IN being changed from a first level to a second level, for example, in response to the buffer input signal IN being changed from a low level to a high level, the first input signal INP, which may be a high level signal, and a second input signal INN, which may be a relatively low-level signal in comparison with the first input signal INP, may be provided to the slew rate boost circuit unit 600 as illustrated in FIG. 8. In one example, the first enable signal EN may be a high-level signal, and the second enable signal EN may become a low-level signal. Accordingly, the first and the second comparators 710, 720 may be enabled.

The output node N3 of the first comparing unit 711 of the first comparator 710 may provide a high-level signal, and may be provided to the gate of the PMOS transistor MP4. The PMOS transistor MP4 may be turned off, and the first signal generating unit 313 may cause the first boost signal Inout not to be generated. The output node N3 of the second comparing unit 721 of the comparator 320 may also become high-level, and may be provided to the gate of the NMOS transistor MN8. The NMOS transistor MN8 may be turned on, and the second signal generating unit 323 may generate the second boost signal Ipout, as illustrated in FIG. 8.

The second boost signal Ipout may be provided to the gate of the pull-up transistor PU of the amplifying circuit unit 281. Accordingly, a pull-up signal provided to the gate of the pull-up transistor PU may increase rapidly, and thus, the buffer output circuit OUT may become high-level rapidly, based on the buffer input signal IN.

The first enable signal EN may become low-level after the buffer output signal OUT is changed to high level in response to the buffer input signal IN being changed from low-level to high-level, and the second enable signal ENB may become high-level. Accordingly, the operation of the first and the second comparators 313, 323 may be disabled. It may be desirable that the second enable signal ENB maintains a low level while the buffer input signal IN is changed from a low level to a high level (e.g., time period t1 in FIG. 8).

In an example embodiment, the first and the second enable signals EN, ENB may be set to be disabled after the first and the second comparators 710, 720 output the buffer output signal OUT based on the buffer input signal IN. Accordingly, after the output signal OUT is output, the operation of the first and the second comparators 710, 720 may be disabled, preventing further consumption of electric current. Therefore, even if a slew rate boost function is added to the output buffer 27, consumption of electric current caused by the slew rate boost function added to the output buffer 27 may not be significant.

Meanwhile, in response to the buffer input signal IN being changed from a second level to a first level, for example, in response to the buffer input signal IN being changed from a high level to a low level, the first input signal INP, which may be a low level signal, and a second input signal INN, which may be a relatively high level in comparison with the first input signal INP, may be provided to the slew rate boost circuit unit 600 as illustrated in FIG. 8. In one example, the first enable signal EN may be a high-level signal, and the second enable signal EN may become a low-level signal. Accordingly, the first and the second comparators 710, 720 may be enabled.

The output signal N3 of the first comparing unit 711 of the first comparator 710 may become a high-level signal, and may be provided to the gate of the PMOS transistor MP4. The PMOS transistor MP4 may be turned off, and the first signal generating unit 313 may cause the first boost signal Inout not to be generated.

The output node N3 of the first comparing unit 711 of the first comparator 710 may become low level and may be provided to the gate of the PMOS transistor MP4. The PMOS transistor MP4 may be turned on, and the first signal generating unit 313 may generate the first boost signal Inout as illustrated in FIG. 5. The output node N4 of the second comparing unit 721 of the comparator 720 may also become low-level, and may be provided to the gate of the NMOS transistor MN8. The NMOS transistor MN8 may be turned off, and the second signal generating unit 323 may cause the second boost signal Ipout not to be generated.

The first boost signal Inout may be provided to the gate of the pull-down transistor PD of the amplifying circuit unit 281. Accordingly, a pull-down signal provided to the gate of the pull-down transistor PD may increase rapidly, and thus, the buffer output circuit OUT may become low-level rapidly.

Likewise, after the first and the second comparators 710, 720 output the buffer output signal OUT based on the buffer input signal IN, the first and the second enable signals EN, ENB may be set to be disabled, disabling the operation of the first and the second comparators 710, 720. It may be desirable that the first enable signal EN maintains a high level while the buffer input signal IN is changed from high level to low level (e.g., time period t2 in FIG. 8).

In the example illustrated in FIG. 6, the pull-up unit and the pull-down unit of the amplifying circuit unit 281 may include a PMOS transistor and an NMOS transistor respectively, but this is only an example. As illustrated in FIG. 4, the pull-up unit may include a pull-up transistor PU and current minors PM1, PM2, and the pull-down unit may include a pull-down transistor PD and current minors PN1, PN2. In one example, the first boost signal Ipout output from the first comparator 710 may be provided to the gate of the pull-down transistor PD directly, unlike in the FIG. 4 example, in which the first boost signal Ipout is provided to the current mirror of the pull-down unit; and the second boost signal Inout output from the second comparator 720 may be provided to the gate of the pull-up transistor PU directly, unlike in the FIG. 4 example, in which the second boost signal Inout is provided to the current minor of the pull-up unit.

In an example embodiment, the first and the second signal generating units of the first and the second comparators may have the PMOS and the NMOS transistors MP3, MN7 to which predetermined first and second bias signals BIASP, BIASN are provided. Thus, first and second boost signals Inout, Ipout in a predetermined level may be generated, performing slew rate boost operation stably.

As described above, drain current of an MOS transistor may be represented as in equation (1) below.

$$I_D=K\cdot W/L\cdot(V_{gs}-V_{th})^2 \quad (1)$$

In the above equation (1), in order to obtain the same slew rate as embodiments from a convention output buffer, the ratio (W/L) of width (W) versus length (L) of a MOS transistor including an output end should be increased to $(W/L)^2$. That is, in embodiments, if gate-source voltage ($V_{gs}$) of a MOS transistor is increased by more than 1V, an area as large as $(W/L)^2$ may be saved.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. For example, phases and transistor types may be transposed, as appropriate. Accordingly, other implementations are within the scope of the following claims.

What is claimed is:

1. A slew rate boost circuit for an output buffer comprising a pull-up unit providing a buffer output signal in a first level by receiving a buffer input signal and performing pull-up operation, and a pull-down unit providing the buffer output signal in a second level having opposite phase from the first level by receiving the buffer input signal and performing pull-down operation, the circuit comprising:

a first comparator configured to generate a first boost signal to boost the pull-up unit of the output buffer; and a second comparator configured to generate a second boost signal to boost the pull-down unit of the output buffer, wherein the first and second boost signals are generated based upon a comparison of the buffer input signal and the buffer output signal, and the first comparator is further configured to be disabled after generating the first boost signal.

2. The circuit of claim 1, wherein the first comparator comprises:

a first comparing unit configured to receive and compare the buffer input and buffer output signals; and a first signal generating unit configured to generate the first boost signal, according to an output signal of the first comparing unit.

3. The circuit of claim 2, wherein:

the pull-up unit comprises:

a PMOS transistor; and a current mirror comprising a pair of PMOS transistors; and the pull-down unit comprises:

an NMOS transistor; and a current mirror comprising a pair of NMOS transistors.

4. The circuit of claim 3, wherein:

the first comparing unit comprises a pair of transistors configured for differential amplification in which a first input signal and a second input signal are provided to a respective gate; and the output signal of the first comparing unit is provided to a drain of a transistor where the first input signal is provided from among the pair of transistors.

5. The circuit of claim 4, wherein the first signal generating unit comprises:

a first PMOS transistor configured to perform a current mirror operation, based on a first bias signal; and a second PMOS transistor which is connected to the first PMOS transistor and configured to generate the first boost signal, based on the output signal of the first comparing unit, wherein the first signal generating unit is further configured to provide the first boost signal to the current mirror of the pull-down unit.

6. The circuit of claim 3, wherein:

the first comparing unit comprises a pair of transistors configured for differential amplification in which a first input signal and a second input signal are provided to a respective gate; and the output signal of the first comparing unit is provided to a drain of a transistor where the second input signal is provided from among the pair of transistors.

7. The circuit of claim 6, wherein the first signal generating unit comprises:

a first PMOS transistor configured to perform a current mirror operation, based on a first bias signal; and a second PMOS transistor which is connected to the first PMOS transistor and configured to generate the first boost signal, based on the output signal of the first comparing unit, wherein the first signal generating unit is further configured to provide the first boost signal to a pull-down transistor of the pull-down unit.

8. The circuit of claim 2, wherein:

the pull-up unit comprises a PMOS transistor; and the pull-down unit comprises an NMOS transistor.

9. The circuit of claim 8, wherein:

the first comparing unit comprises a pair of NMOS transistors configured for differential amplification in which a first input signal and a second input signal are provided to a respective gate; and the output signal of the first comparing unit is provided to a drain of a transistor where the second input signal is provided from among the NMOS transistors.

10. The circuit of claim 7, wherein the first signal generating unit comprises:

a first PMOS transistor configured to perform a current mirror operation, based on a first bias signal; and a second PMOS transistor which is connected to the first PMOS transistor and configured to generate the first boost signal, based on the output signal of the first comparing unit, wherein the first signal generating unit is further configured to provide the first boost signal to the pull-down transistor of the pull-down unit.

11. The circuit of claim 2, wherein the first comparator further comprises a first controller configured to disable operation of the first comparing unit after the first comparing unit generates the first boost signal.

12. The circuit of claim 11, wherein the first controller comprises a first NMOS transistor which is connected to the first comparing unit and configured to disable operation of the first comparing unit, based on a first enable signal.

13. The circuit of claim 1, wherein the second comparator is further configured to be disabled after generating the second boost signal.

14. The circuit of claim 1, wherein the second comparator comprises:

a second comparing unit configured to input and compare the buffer input and buffer output signals; and a second signal generating unit configured to generate the second boost signal, according to an output signal of the second comparing unit.

15. The circuit of claim 14, wherein:

the pull-up unit comprises:

a PMOS transistor; and a current mirror comprising a pair of PMOS transistors; and the pull-down unit comprises:

an NMOS transistor; and a current mirror comprising a pair of NMOS transistors.

16. The circuit of claim 15, wherein:

the second comparing unit comprises a pair of PMOS transistors configured for differential amplification in which a first input signal and a second input signal are provided to a respective gate; and the output signal of the second comparing unit is provided to a drain of a transistor where the first input signal is provided from among the PMOS transistors.

17. The circuit of claim 16, wherein the second signal generating unit comprises:

a second NMOS transistor configured to perform a current mirror operation, based on a second bias signal comprising an opposite phase from a first bias signal; and a third NMOS transistor which is connected to the second NMOS transistor and configured to generate the second boost signal, based on the output signal of the second comparing unit, wherein the second signal generating unit is further configured to provide the second boost signal to the current mirror of the pull-up unit.

18. The circuit of claim 15, wherein:

the second comparing unit comprises a pair of PMOS transistors configured for differential amplification in which a first input signal and a second input signal are provided to a respective gate; and the output signal of the second comparing unit is provided to a drain of a transistor where the second input signal is provided from among the PMOS transistors.

19. The circuit of claim 18, wherein the second signal generating unit comprises:

a second NMOS transistor configured to perform a current mirror operation, based on a second bias signal comprising an opposite phase from a first bias signal; and a third NMOS transistor which is connected to the second NMOS transistor and configured to generate the second boost signal, based on the output signal of the second comparing unit, wherein the second signal generating unit is further configured to provide the second boost signal to a pull-up transistor of the pull-up unit.

20. The circuit of claim 14, wherein:

the pull-up unit comprises a PMOS transistor; and the pull-down unit comprises an NMOS transistor.

21. The circuit of claim 20, wherein:

the first comparing unit comprises a pair of PMOS transistors configured for differential amplification in which a first input signal and a second input signal are provided to a respective gate; and the output signal of the second comparing unit is provided to a drain of a transistor where the second input signal is provided from among the PMOS transistors.

22. The circuit of claim 21, wherein the second signal generating unit comprises:

a second NMOS transistor configured to performs a current mirror operation, based on a second bias signal comprising an opposite phase from a first bias signal; and a third PMOS transistor which is connected to a second PMOS transistor and configured to generate the second boost signal, based on the output signal of the second comparing unit, wherein the second signal generating unit is further configured to provide the second boost signal to a pull-up transistor of the pull-up unit.

23. The circuit of claim 14, wherein the second comparator further comprises a second controller configured to disable operation of the second comparing unit after the second comparing unit generates the second boost signal.

24. The circuit of claim 23, wherein the second controller comprises a third PMOS transistor which is connected to the second comparing unit and configured to disable operation of the first comparing unit, based on a second enable signal comprising an opposite phase from the first enable signal.

25. An output buffer for a source driver, the output buffer comprising:

an amplifying circuit unit comprising:

a pull-up unit configured to provide a buffer output signal in a first level by performing a pull-up operation;

a pull-down unit configured to provide the buffer output signal in a second level comprising an opposite phase from the first level by performing a pull-down operation; and a slew rate boost circuit unit configured to generate a first boost signal and a second boost signal, the first boost signal and the second boost signal being configured to respectively boost the pull-up unit and the pull down unit of the amplifying circuit unit, wherein the first and second boost signals are generated based upon a comparison of a buffer input signal and the buffer output signal.

26. The output buffer of claim 25, wherein the slew rate boost circuit unit comprises:

a first comparator configured to:

input the buffer input and buffer output signals; and generate the first boost signal; and a second comparator configured to:

input the buffer input and buffer output signals; and generate the second boost signal.

27. The output buffer of claim 26, wherein each of the first and the second comparators comprises:

a comparing unit configured to input and compare the buffer input and buffer output signals; and a signal generating unit configured to generate the first and second boost signals, according to an output signal of the comparing unit.

28. The output buffer of claim 27, wherein each of the comparators further comprises a controller configured to disable operation of the comparators, based on a first enable signal and a second enable signal after the comparators generate the first and the second boost signals.

29. A source driver with an output buffer which inputs an input signal and provides an output signal, the source driver comprising:

an amplifying circuit unit comprising:

a pull-up unit configured to provide a buffer output signal in a first level by performing a pull-up operation;

a pull-down unit configured to provide the buffer output signal in a second level comprising an opposite phase from the first level by performing a pull-down operation; and a slew rate boost circuit unit configured to generate a first boost signal and a second boost signal, the first boost signal and the second boost signal being configured to respectively boost the pull-up unit and the pull down unit of the amplifying circuit unit, wherein the first and second boost signals are generated based upon a comparison of a buffer input signal and the buffer output signal.

30. A method for a slew rate boost circuit for an output buffer, the method comprising:

generating, by a first comparator, a first boost signal to boost a pull-up unit of the output buffer; and generating, by a second comparator, a second boost signal to boost a pull-down unit of the output buffer, wherein the first and second boost signals are generated based upon a comparison of a buffer input signal and a buffer output signal, and the first comparator is further configured to be disabled after generating the first boost signal.

31. A slew rate boost circuit for an output buffer, the circuit comprising:

a first comparator configured to generate a first boost signal to boost a pull-up unit of the output buffer; and a second comparator configured to generate a second boost signal to boost a pull-down unit of the output buffer, wherein the first and second boost signals are generated based upon a comparison of a buffer input signal and a buffer output signal, and the first comparator is further configured to be disabled after generating the first boost signal.

32. The circuit of claim 31, wherein the first comparator comprises:

a first comparing unit configured to receive and compare the buffer input signal and the buffer output signal; and a first signal generating unit configured to generate the first boost signal, according to an output signal of the first comparing unit.

33. The circuit of claim 31, wherein the second comparator comprises:

a second comparing unit configured to input and compare the buffer input signal and the buffer output signal; and a second signal generating unit configured to generate the second boost signal, according to an output signal of the second comparing unit.

* * * * *